(12) United States Patent
Marazzo

(10) Patent No.: US 10,813,254 B2
(45) Date of Patent: Oct. 20, 2020

(54) THERMAL MANAGEMENT AND POWER SYSTEM FOR COMPUTING INFRASTRUCTURE

(71) Applicant: Christopher Marazzo, New York, NY (US)

(72) Inventor: Christopher Marazzo, New York, NY (US)

(*) Notice: Subject to any disclaimer, the term of this patent is extended or adjusted under 35 U.S.C. 154(b) by 320 days.

(21) Appl. No.: 16/034,624

(22) Filed: Jul. 13, 2018

(65) Prior Publication Data

US 2020/0022289 A1  Jan. 16, 2020

(51) Int. Cl.
| | |
|---|---|
| *H05K 7/20* | (2006.01) |
| *F25J 1/02* | (2006.01) |
| *F03D 9/28* | (2016.01) |
| *F01D 15/10* | (2006.01) |
| *H01L 23/44* | (2006.01) |

(52) U.S. Cl.
CPC ......... *H05K 7/20818* (2013.01); *F01D 15/10* (2013.01); *F03D 9/28* (2016.05); *F25J 1/0235* (2013.01); *H01L 23/445* (2013.01); *H05K 7/203* (2013.01); *H05K 7/20236* (2013.01); *H05K 7/20327* (2013.01); *H05K 7/20372* (2013.01); *H05K 7/20736* (2013.01); *F05B 2220/70* (2013.01); *F05D 2220/76* (2013.01)

(58) Field of Classification Search
CPC .... F25J 3/0423; F25J 3/04672; F25J 2230/42; F25J 3/04084; F25J 3/0406; F25J 3/04121; F25J 3/04387; F25J 3/04781; F25J 1/0015; F25J 1/0072; F25J 1/0234; F25J 1/0235; F02C 6/08; F02C 7/141; F02C 7/143; F02C 7/185; F02C 9/18; F25D 3/10; F25D 29/001; H05K 7/20327; H05K 7/20381; H05K 7/20772; H05K 7/203; H05K 7/20372; H05K 7/20709; H05K 7/20736; H05K 7/20745; H05K 7/20818; H05K 7/20827; H01L 23/445
See application file for complete search history.

(56) References Cited

U.S. PATENT DOCUMENTS

| | | |
|---|---|---|
| 3,886,748 A | 8/1975 | Bronicki |
| 4,158,354 A | 6/1979 | Carden |
| 4,223,540 A * | 9/1980 | Longsworth .............. H01F 6/04 62/51.1 |
| 4,526,595 A * | 7/1985 | McNeil ................ F25J 3/04412 62/651 |

(Continued)

OTHER PUBLICATIONS

Zhang, X. et al., "Cooling Energy Consumption Investigation of Data Center IT Room with Vertical Placed Server." Energy Procedia 105 (2017) 2047-2052. The 8th International Conference on Applied Energy—ICAE 2016. [Date accessed Oct. 19, 2017]: available online at www.sciencedirect.com.

(Continued)

*Primary Examiner* — Robert J Hoffberg
*Assistant Examiner* — Michael A Matey
(74) *Attorney, Agent, or Firm* — Michael J. Feigin, Esq.; Feigin and Fridman LLC

(57) ABSTRACT

A data center is cooled by a cryogenic cooling system which is wind driven, and powered by energy stored in the cryogenic liquid. The cooling occurs through downwardly passing cryogenic liquid which is recycled and pushed back to a top of a system in a cyclic manner.

20 Claims, 3 Drawing Sheets

(56) References Cited

U.S. PATENT DOCUMENTS

| | | | | |
|---|---|---|---|---|
| 5,165,245 A | * | 11/1992 | Agrawal | F25J 3/04181 |
| | | | | 62/646 |
| 5,735,127 A | * | 4/1998 | Pfotenhauer | F25B 9/14 |
| | | | | 165/4 |
| 6,983,598 B2 | | 1/2006 | Dearman | |
| 7,957,132 B2 | | 6/2011 | Fried | |
| 7,980,078 B2 | | 7/2011 | McCutchen et al. | |
| 8,065,874 B2 | | 11/2011 | Fong et al. | |
| 9,145,795 B2 | | 9/2015 | Lehar et al. | |
| 9,243,518 B2 | | 1/2016 | Cook | |
| 9,258,926 B2 | * | 2/2016 | Smith | H05K 7/20818 |
| 2008/0024980 A1 | * | 1/2008 | Suzuki | G06F 1/203 |
| | | | | 361/691 |
| 2008/0148754 A1 | | 6/2008 | Snytsar | |
| 2009/0126910 A1 | * | 5/2009 | Campbell | H05K 7/20781 |
| | | | | 165/104.33 |
| 2009/0282840 A1 | * | 11/2009 | Chen | F25J 1/0242 |
| | | | | 62/50.3 |
| 2010/0287956 A1 | * | 11/2010 | Bowdish | F25D 3/10 |
| | | | | 62/50.7 |
| 2012/0324933 A1 | * | 12/2012 | Louvar | H05K 7/20327 |
| | | | | 62/196.4 |
| 2015/0053430 A1 | * | 2/2015 | Beresford | A62C 99/0018 |
| | | | | 169/45 |
| 2015/0078504 A1 | * | 3/2015 | Woolley | G21C 1/14 |
| | | | | 376/100 |
| 2016/0014933 A1 | * | 1/2016 | Matsunaga | B23P 19/00 |
| | | | | 361/679.53 |
| 2016/0120059 A1 | * | 4/2016 | Shedd | F28F 13/02 |
| | | | | 165/244 |
| 2016/0231049 A1 | * | 8/2016 | Baik | F25J 1/0276 |
| 2017/0127556 A1 | * | 5/2017 | Smith | H05K 5/068 |
| 2020/0093038 A1 | * | 3/2020 | Enright | H05K 7/203 |
| 2020/0141637 A1 | * | 5/2020 | Turney | F25J 1/0052 |
| 2020/0163254 A1 | * | 5/2020 | Eadelson | H05K 7/20318 |

OTHER PUBLICATIONS

Lim, Yvonne et al., "Liquid Air as an Energy Storage: A Review." Journal of Engineering Science and Technology, vol. 11, No. 4 (2016), 496-515. [Date accessed Mar. 12, 2018].

Zotter G. et al., "Thermodynamic Analysis of a Novel Cryogenic Rankine Cycle for Wind Energy Storage." 'roceedings of ASME Turbo Expo 2012, GT 2012, Jun. 11015, 2012, Copenhagen, Denmark. [Date accessed Jan. 18, 2018]: http://proceedings.asmedigitalcollection.asme.org/.

* cited by examiner

THERMAL MANAGEMENT AND POWER SYSTEM FOR COMPUTING INFRASTRUCTURE

FIELD OF THE DISCLOSED TECHNOLOGY

The disclosed technology relates generally to methods and systems for cooling and powering computer infrastructure using renewable power.

BACKGROUND OF THE DISCLOSED TECHNOLOGY

A common metric of computer system performance, especially in numeric/scientific applications, is the number of operations the system is able to carry out a per second, using units called FLOPS (Floating Point Operations Per Second). The fastest computer systems currently existing have a FLOPS rate of $10^{15}$ to $10^{17}$.

Scientists are constantly trying to increase the FLOPS measure of computers. Such an increase can be achieved by increasing the number of operations the system can carry out per second, or by increasing the number of computational nodes operative to carry out the operations in a concurrent manner. The former, known as frequency scaling, greatly increases the power consumption of the system, and the input power is dissipated as heat by the chips of the system, requiring additional peripheral devices, such as fans and cooling devices, to remove the heat and prevent a meltdown from happening. As a result, priority for increasing the processing speed of computers has shifted to parallel scaling, or using multiple computational nodes to carry out operations simultaneously.

The priority given to parallel computing, and the ubiquity of connectivity, for example via the Internet, have encouraged the migration of computational loads away from local computing devices and into centralized facilities, known as data centers or server farms. These centralized facilities form a host/client relationship with the local device, and remotely carry out processing operations for the local device, in some cases using parallel computing. However, because data centers include a plurality of servers, significant cooling systems are required in order to prevent overheating of the data center.

In existing data centers, grid power is introduced, and is converted to DC at a junction that also includes a battery bank and backup generators. This structure ensures continued power availability and reliable operation in the event of power loss. The servers in the data centers are arranged in cabinets known as racks, which are cooled by delivery of cool air to the racks, removal of the hot air which has absorbed heat from the servers, and re-cooling the air—typically using chilled water. Such cooling systems tend to be inefficient, since the heat capacity of air is low, and the ability to dynamically scale cooling is limited. Additionally, the cost of electricity, availability of municipal water, availability of cool ambient air, and land costs all have a significant impact on the economics of cooling data centers.

Water cooling of server chips, for example in a data center, is possible by attaching "water mounts" that act as heat exchangers, and pumping water or a water/glycol mixture through the mounts. Alternatively, one may cool the servers by direct immersion cooling, which is a method in which dielectric fluid is used as the heat transfer fluid for cooling the server chips, and the servers are immersed in the heat transfer fluid.

Cryogenic fluids like liquid nitrogen and liquid air have been explored as potential way to store energy for over 100 years. Liquid nitrogen is −196 degrees Celsius, and therefore is boiling at ambient temperature. A cryogenic rankine cycle can be designed on this principle, which is essentially a steam engine using a cryogenic working fluid instead of water and ambient heat instead of the combustion-derived heat. The Dearman engine is an improved cryogenic rankine engine, in which a heat exchange fluid, for example including water and glycol, is heated and directly mixed with the liquid nitrogen, resulting in improved heat exchange efficiency and overall performance.

Cryogenic rankine engines have also been disclosed as an energy storage systems. In such systems, when electric supply exceeds demand, the system uses electricity to generate liquefy air. Later, when demand is elevated, the liquid air is allowed to become gaseous, and the force of expansion is converted back to electricity. Such systems could support grid stability when electricity is supplied from fluctuating power resources like wind and solar.

SUMMARY OF THE DISCLOSED TECHNOLOGY

The disclosed technology relates generally to methods and systems for cooling computer infrastructure using renewable power.

More specifically, the disclosed technology provides a cryogenic fluid mechanism for providing power to a data center and for heat management thereof, where the cryogenic fluid is liquefied based on wind energy. The data center is constructed as a multi-story building functioning as a windmill, where the wind energy is used to drive a liquefying mechanism for a cryogenic fluid, which is then used as an energy storage medium for generating electricity for powering the data center, while cooling the components thereof.

In accordance with some aspects of an embodiment of the teachings herein, there is provided a data center, including:
a plurality of computer servers;
a cooling subsystem including a cooling fluid for removing heat from the plurality of computer servers, and collecting the cooling fluid following heating thereof by the plurality of computer servers;
a nitrogen liquefying subsystem liquefying gaseous nitrogen to form liquid nitrogen; and
a fluid return subsystem receiving the heated cooling fluid and using the liquid nitrogen to cool the heated cooling fluid and to provide pressure for returning the heated cooling fluid, following cooling thereof, to the cooling subsystem.

In some embodiments, the data center further includes:
a pressure swing absorber adapted to isolate gaseous nitrogen from ambient air; and
a wind turbine functionally associated with the pressure swing absorber and with the nitrogen liquefying subsystem, the wind turbine adapted to introduce ambient air into the pressure swing absorber.

In some embodiments, the cooling subsystem includes a cooling fluid reservoir, and wherein the pressure swing absorber provides the gaseous nitrogen into the cooling fluid reservoir, from where the gaseous nitrogen enters the nitrogen liquefying subsystem.

In some embodiments, power of the wind turbine is adapted to drive one or more stages of compressor used to liquefy gaseous nitrogen in the nitrogen liquefying subsystem.

In some embodiments, the fluid return subsystem includes:
a heated fluid expansion chamber;
a fluid turbine, receiving fluid under pressure from the heated fluid expansion chamber, the fluid under pressure driving the fluid turbine, electricity generated by the fluid turbine adapted to operate at least part of the plurality of computer servers; and a fluid return pipe enabling return of the cooling fluid from the fluid turbine to the cooling subsystem.

In some embodiments, a liquid nitrogen feed pipe extends from the nitrogen liquefying subsystem into the heated fluid expansion chamber, at least partially within the fluid return pipe.

In some embodiments, liquid nitrogen entering the heated fluid expansion chamber via the liquid nitrogen feed pipe vaporizes and causes an increase in pressure in the heated fluid expansion chamber, resulting in the fluid under pressure provided to the fluid turbine.

In some embodiments, the plurality of computer servers and the cooling subsystem are arranged such that cooling fluid flows from the cooling subsystem to the vicinity of the plurality of computer servers, and the heated cooling fluid flows from the vicinity of the plurality of computer servers to the fluid return subsystem, under gravitational pull.

In accordance with some aspects of another embodiment of the teachings herein, there is provided a heat and power management system for use in a data center including a plurality of computer servers, the heat and power management system including:
a cooling subsystem including a cooling fluid adapted to remove heat from the plurality of computer servers, and to be collected, following heating thereof by the plurality of computer servers;
a nitrogen liquefying subsystem liquefying gaseous nitrogen to form liquid nitrogen; and
a fluid return subsystem receiving the heated cooling fluid and using the liquid nitrogen to cool the heated cooling fluid and to provide pressure for returning the heated cooling fluid, following cooling thereof, to the cooling subsystem,
wherein the fluid return subsystem includes a fluid turbine driven by the heated cooling fluid and adapted to provide power to at least part of the plurality of computer servers.

In some embodiments, the heat and power management system further includes a pressure swing absorber adapted to isolate gaseous nitrogen from ambient air and to provide the gaseous nitrogen into the nitrogen liquefying subsystem via the cooling subsystem and a wind turbine functionally associated with the pressure swing absorber and with the nitrogen liquefying subsystem, the wind turbine adapted to introduce ambient air into the pressure swing absorber, wherein power generated from the wind turbine is adapted to power the nitrogen liquefying subsystem.

In some embodiments, the fluid return subsystem includes a fluid return pipe enabling return of the cooling fluid from the fluid turbine to the cooling subsystem.

In some embodiments, a liquid nitrogen feed pipe extends from the nitrogen liquefying subsystem into the heated fluid expansion chamber, at least partially within the fluid return pipe.

In some embodiments, liquid nitrogen entering the heated fluid expansion chamber via the liquid nitrogen feed pipe causes an increase in pressure in the heated fluid expansion chamber, resulting in the fluid under pressure provided to the fluid turbine.

In some embodiments, the system is arranged such that cooling fluid flows from the cooling subsystem to the vicinity of the plurality of computer servers, and the heated cooling fluid flows from the vicinity of the plurality of computer servers to the fluid return subsystem, under gravitational pull.

In accordance with some aspects of a further embodiment of the teachings herein, there is provided a method for cooling a plurality of computer servers in a data center, the method including:
providing gaseous nitrogen into a cooling fluid disposed in a cooling fluid reservoir;
liquefying gaseous nitrogen from the cooling fluid reservoir to form liquid nitrogen;
allowing the cooling fluid to flow from the cooling fluid reservoir to a vicinity of the plurality of computer servers, to collect heat therefrom;
allowing the heated cooling fluid to flow from the vicinity of the plurality of computer servers to a heated fluid expansion chamber;
pushing the heated cooling fluid, under pressure, from the heated fluid expansion chamber, via a fluid turbine and a return pipe, back to the cooling fluid reservoir; and
using the liquid nitrogen, cooling the heated cooling fluid while the heated cooling fluid is flowing in the return pipe.

In some embodiments, providing gaseous nitrogen includes:
using a wind turbine, introducing ambient air into the data center;
isolating gaseous nitrogen from the ambient air; and
providing the isolated gaseous nitrogen into the cooling fluid,
wherein the liquefying is carried out using power generated from mechanical power of wind by the wind turbine.

In some embodiments, pushing the heated cooling fluid includes introducing into the heated fluid expansion chamber at least some of the liquid nitrogen, such that evaporation of the at least some liquid nitrogen increases pressure within the heated fluid expansion chamber.

In some embodiments, the method further includes generating electricity from the fluid turbine when the heated cooling fluid under pressure flows through the fluid turbine, and using the electricity to power at least some of the plurality of computer servers.

In some embodiments, cooling the heated cooling fluid includes providing flowing liquid nitrogen through a liquid nitrogen pipe disposed within the return pipe while the heated cooling fluid is flowing through the return pipe, such that the liquid nitrogen absorbs heat from the heated cooling fluid in the return pipe.

In some embodiments, the cooling fluid flows from the cooling fluid reservoir to a vicinity of the plurality of computer servers and the heated cooling fluid flows from the vicinity of the plurality of computer servers to the heated fluid expansion chamber under gravitational pull.

"Substantially" and "substantially shown," for purposes of this specification, are defined as "at least 90%," or as otherwise indicated. Any device may "comprise" or "consist of" the devices mentioned there-in, as limited by the claims.

It should be understood that the use of "and/or" is defined inclusively such that the term "a and/or b" should be read to include the sets: "a and b," "a or b," "a," "b."

DETAILED DESCRIPTION OF EMBODIMENTS OF THE DISCLOSED TECHNOLOGY

Embodiments of the disclosed technology include a data center, cooled by a cryogenic cooling system which is wind driven, and powered by energy stored in the cryogenic liquid.

Figure 1:
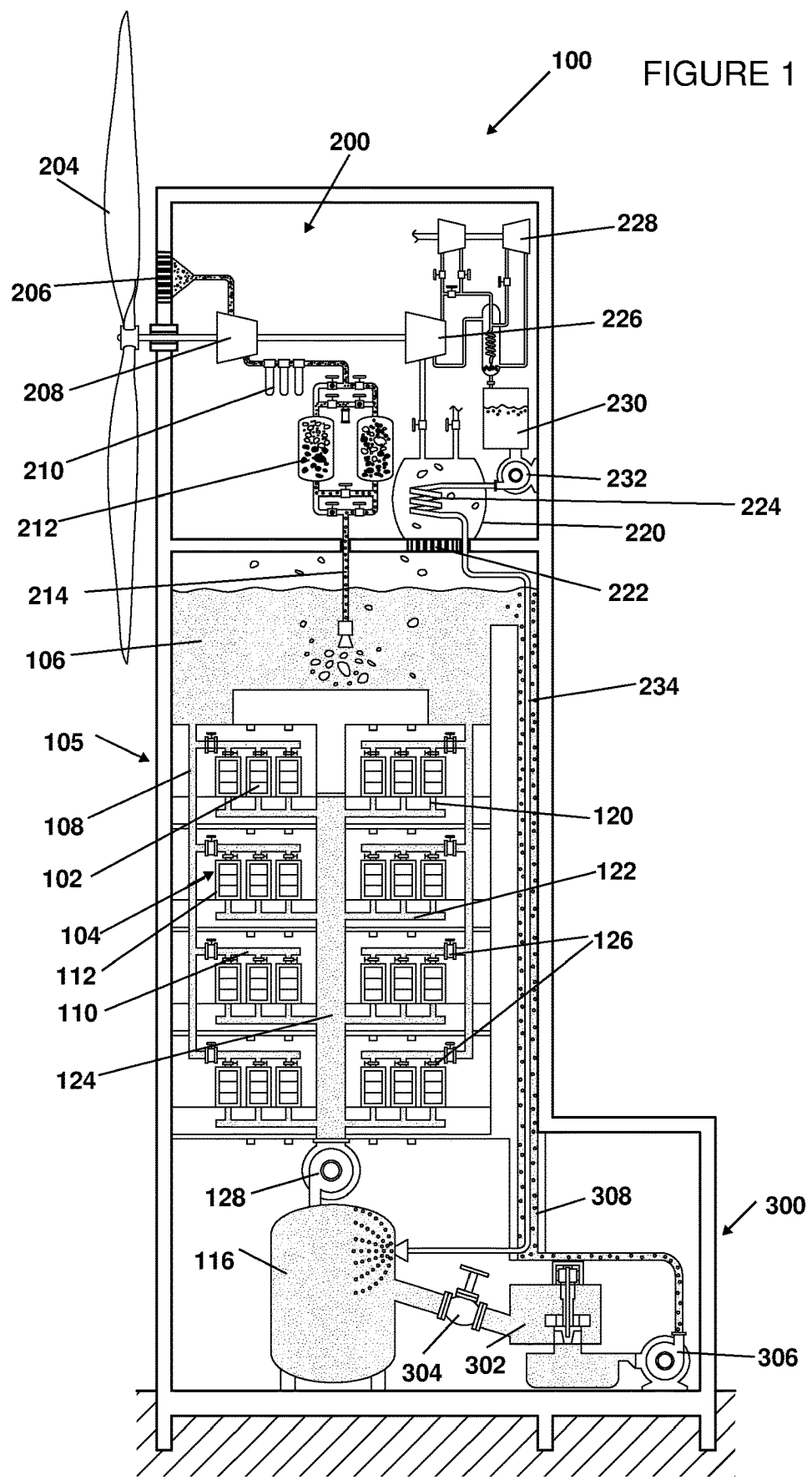
FIG. 1 is a schematic illustration of an embodiment of a data center including a cryogenic cooling system according to an embodiment of the disclosed technology.
Figure 2A:
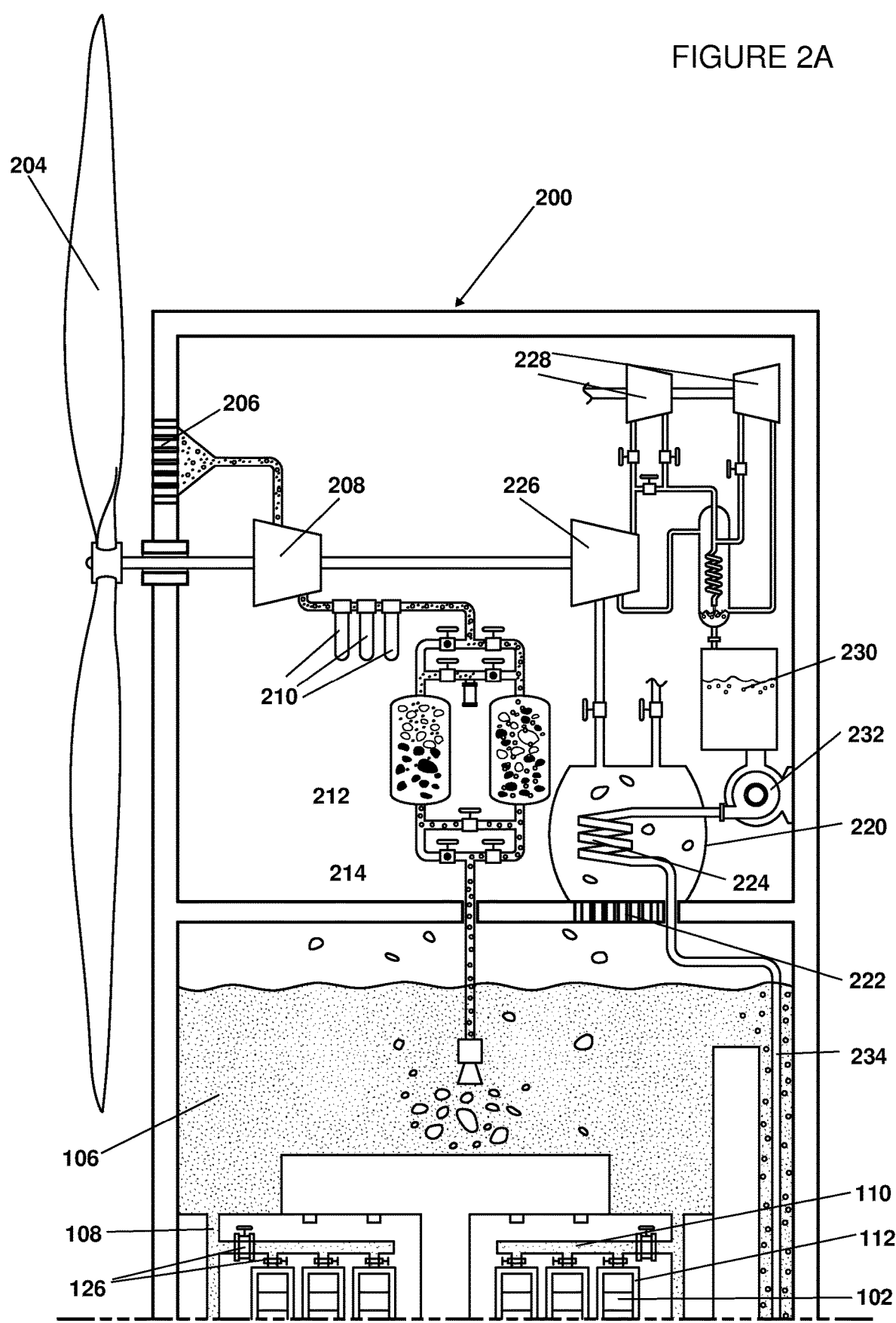
FIGS. 2A and 2B are enlarged schematic illustrations of two portion of FIG. 1.
Figure 2B:
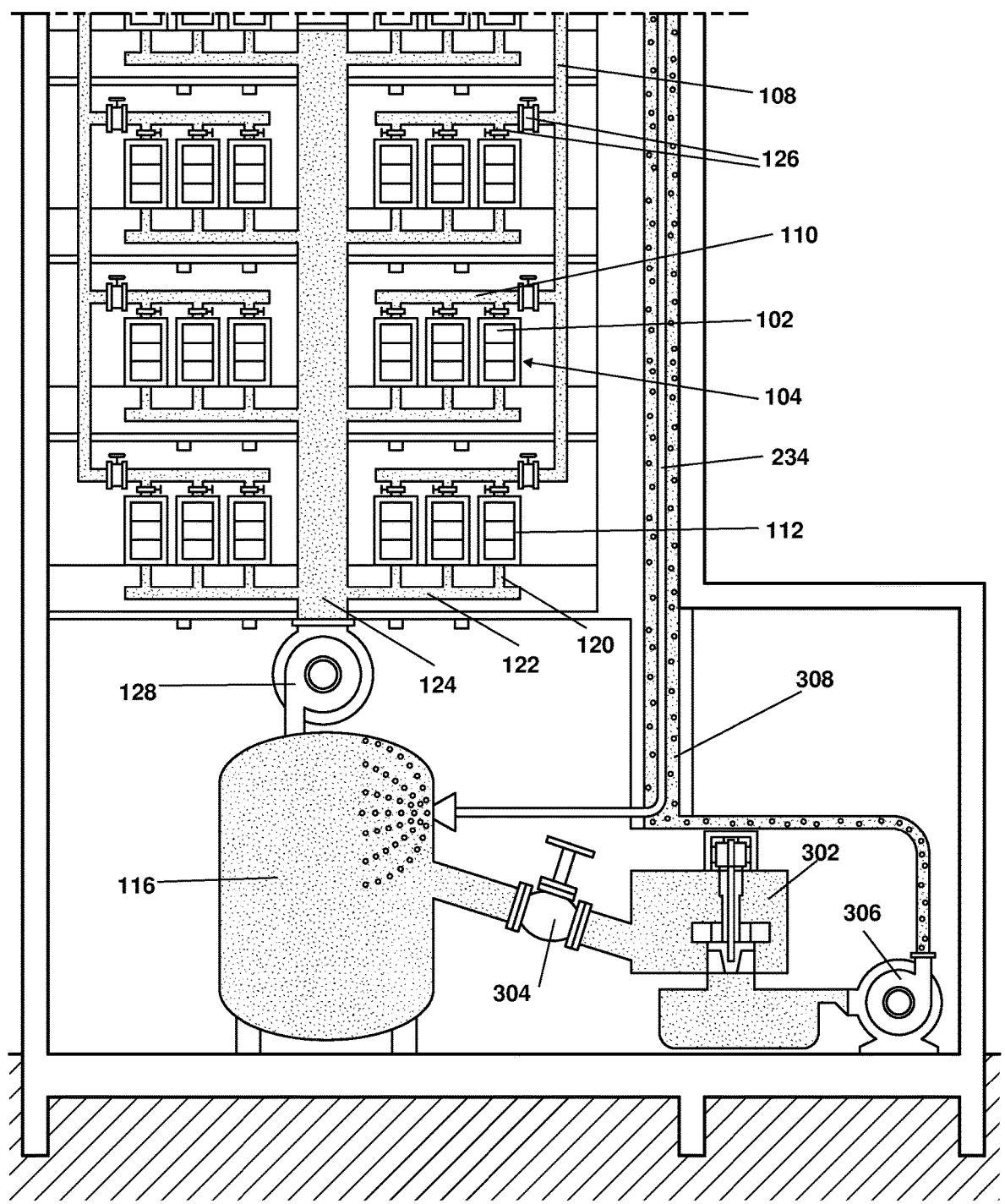

Reference is now made to FIG. 1, which is a schematic illustration of an embodiment of a data center including a cryogenic cooling system according to an embodiment of the disclosed technology, and to FIGS. 2A and 2B, which are enlarged schematic illustrations of two portion of FIG. 1.

As seen in the Figures, a data center 100 includes a plurality of computer servers 102, arranged in racks 104.

A cooling subsystem 105 includes a cooling fluid reservoir 106, disposed vertically above racks 104 and having a cooling fluid therein. For example, the cooling fluid may be a dielectric fluid, such as 3M Novec commercially available from 3M of St. Paul Minn. Cooling fluid pipes 108 extend from cooling fluid reservoir downwardly along the racks 104, in some embodiments along exterior walls of the data center. Transverse inlet pipes 110 extend from cooling fluid pipes 108 to each of racks 104, enabling cooling fluid from the reservoir 106 to flow to the vicinity of each of the racks 104 under gravitational pull. The inlet pipes 110 each terminate in an immersion enclosure 112 enabling cooling fluid to immerse the rack 104 and/or individual computer servers 102 therein in cooling fluid, thereby to absorb heat from the computer servers.

A heated fluid expansion chamber 116 is disposed vertically beneath rack 104. Outlets 120 extend from immersion enclosures 112, via transverse outlet pipes 122 to a central heated fluid pipe 124, which terminates at heated fluid expansion chamber 116. Outlets 120, outlet pipes 122, and heated fluid pipe 124 are adapted to remove heated cooling fluid, which has absorbed heat from computer servers 102, from the vicinity of racks 104 and into expansion chamber 116, where energy may be recovered from the waste heat, as explained in further detail hereinbelow.

Due to the arrangement of cooling fluid reservoir 106 and racks 104 at different vertical heights, cooling fluid can flow from reservoir 106 to immersion enclosures 112 under gravitational pull. Similarly, due to the arrangement of racks 104 and expansion chamber 116 at different vertical heights, heated cooling fluid can flow from immersion enclosures 112 to expansion chamber 116 under gravitational pull. As such, little or no electrical energy need be invested for operating pumps to direct the fluids in the cooling subsystem.

In some embodiments, adjustable flow control valves 126 may be situated at the connection between cooling fluid pipes 108 and each of inlet pipes 110, and/or at the connection between inlet pipes 110 and immersion enclosures 112. Such valves may be used to precisely control the flow rate from the cooling fluid reservoir 106 to the immersion enclosures 112, without the need of pumps or other devices.

In some embodiments, central heated fluid pipe 124 terminates in a pump 128, which is adapted to maintain and control the pressure of the fluid within expansion chamber 116, and to prevent back flow from the expansion chamber to the central heated fluid pipe.

Because of height differences between cooling fluid reservoir 106, racks 104, and expansion chamber 116, and the use of gravitation to cause fluids to flow through the system rather than active pumping, racks 104 may be arranged vertically one above the other, as illustrated in FIG. 1, without requiring additional power for pumping the cooling fluid to a greater height. As such, the data center may have a smaller land footprint, thus reducing the cost of creating and maintaining such a data center. A vertically arranged data center, which would naturally result in a taller building than a data center in which the racks are arranged horizontally, which allows for more effective integration of wireless communication equipment and allows for greater utilization of wind energy, as explained in further detail hereinbelow.

As explained in further detail hereinbelow, cooling of the heated cooling fluid is based on use of a cryogenic liquid, such as liquid nitrogen. As such, data center 100 includes a nitrogen liquefying subsystem 200.

Nitrogen liquefying subsystem 200 is powered by a wind turbine 204, which converts mechanical energy of the wind into cryogenic fluid for cooling and energy storage. Wind turbine 204 also draws ambient air into nitrogen liquefying subsystem 200 via an initial particulate filter 206 and a first compressor 208. The compressed ambient air is fed from first compressor 208, via a set of filters and dryers 210, adapted to remove water vapor, carbon dioxide, and other trace contaminants from the compressed air. The dried and filtered air is provided to a pressure swing absorber 212, which isolates gaseous nitrogen from other gases in the air.

The isolated gaseous nitrogen is then pumped into the cooling fluid within cooling fluid reservoir 106 via a gaseous nitrogen pipe 214. The isolated gaseous nitrogen is intermixed with cold nitrogen gas being exhausted into the cooling fluid reservoir from the cooling process, as explained in further detail hereinbelow. Subsequently, nitrogen gas bubbling out of the cooling fluid in reservoir 106 enters a heat exchanger 220, via a filter 222. Heat exchanger 220 includes a pipe 224 through which flows liquid nitrogen being pumped to expansion chamber 116, as explained in further detail hereinbelow.

The gaseous nitrogen undergoes second and third stages of compression by compressors 226 and 228, as part of a Claude's cycle liquefaction process as known in the art. Liquid nitrogen resulting from the Claude's cycle liquefaction, is pumped from a liquid nitrogen reservoir 230 by a pump 232, via pipe 224 within heat exchanger 220, and via a liquid nitrogen flow pipe 234, to expansion chamber 116, as explained in further detail hereinbelow.

In accordance with the embodiment disclosed herein, ambient nitrogen entering nitrogen liquefying subsystem 200 undergoes two stages of precooling prior to entering the Claude's cycle, thereby greatly improving the efficiency of the liquefaction process.

In some embodiments, the nitrogen liquefying subsystem 200 includes a vent to the environment, enabling venting of gaseous nitrogen which cannot be liquefied, for example because there is no capacity to liquefy the excess gaseous nitrogen. Furthermore, the amount of gaseous nitrogen may be allowed to build up within reservoir 106, and the pressure caused thereby may provide an effective pumping mechanism for the cooling fluid.

In some embodiments, the cooling fluid in reservoir 106 may be allowed to circulate through heat exchangers and absorb heat from the ambient external environment, when needed, in order to maintain the thermal stability of the cooling fluid in reservoir 106.

In some embodiments, such as the illustrated embodiment, the nitrogen liquefying subsystem is disposed vertically above the reservoir 106, thereby increasing the potential energy of the liquid nitrogen and reducing the pumping required for liquid nitrogen to flow through liquid nitrogen flow pipe 234 to expansion chamber 116. Furthermore, the taller the data center, the greater the wind energy available to wind turbine 204.

A fluid return subsystem 300, enables the recycling of the heated cooling fluid from expansion chamber 116 back to cooling fluid reservoir 106, while using the heat energy stored in the cooling fluid to generate electricity, using a cryogenic rankine cycle. The generated electricity can then be used to power computer equipment, such as some or all of servers 102, or any other suitable equipment.

As seen in the Figures, liquid nitrogen flow pipe 234, which has highly pressurized liquid nitrogen flowing therethrough, terminates at expansion chamber 116. The liquid nitrogen has been previously heated, both in pipe 224 within heat exchanger 220 and while flowing along liquid nitrogen flow pipe 234, as explained in further detail below, is injected into the heated cooling fluid in expansion chamber 116. Due to the extreme temperature difference between the liquid nitrogen and the heated cooling fluid, the liquid nitrogen flash vaporizes, and undergoes a roughly 700-fold increase in volume. This increase in volume within expansion chamber 116 causes a surge in pressure, which is converted into DC electric power by a fluid turbine 302.

It will be appreciated by people of skill in the art that the direct contact between the liquid nitrogen and the cooling fluid is conducive to near-isothermal expansion of the liquid nitrogen, and thus to improved efficacy of the fluid turbine 302.

In some embodiments, a valve 304 is disposed between expansion chamber 116 and fluid turbine 302, for control over the flow rate and pressure between said expansion chamber and turbine. After flowing through fluid turbine 302, the mixture of heated cooling fluid and nitrogen gas therein is pumped back to cooling fluid reservoir 106. More specifically, a pump 306 pumps the fluid mixture via a fluid return pipe 308 terminating at reservoir 106. Fluid return pipe 308 is disposed about liquid nitrogen flow pipe 234, such that the liquid nitrogen flowing down pipe 234 absorbs heat from the heated cooling fluid flowing up fluid return pipe 308. This heat absorption have multiple benefits:

heat is removed from the returning cooling fluid by the time it reaches reservoir 106;

heat from the cooling fluid preheats the liquid nitrogen flowing down pipe 234 to the expansion chamber; and the fluid mixture includes some nitrogen gas which has been cooled in return pipe 308, and this cooled nitrogen gas bubbles out at the top of the reservoir 106 and is ready for being re-liquefied or released into the environment.

Earlier studies of simple liquid nitrogen energy storage systems have estimated the round-trip efficiency of such systems at 7-8%. However, the inventors have surprisingly found that pre-cooling the gaseous nitrogen, prior to liquefying thereof, and recovering the waste heat emitted from the computer infrastructure in the data center, have increased the efficiency of the system to be in the range of 30-50%.

The inventors have further found that using a heat and power management system as described herein when operating a data center removes the costs and efficiency losses associated with stepping down the grid power and converting it to DC electric power.

Furthermore, the inventors have found that because cooling fluids, such as dielectric fluids, have a higher heat capacity than air, the structure described herein enables the servers 102 to be packed more closely within the data center. Consequently, losses relating to electrical wiring are mitigated, and the data interconnects between the servers 102 can be shorter, thus decreasing the latency and increasing the computational performance of the data center.

Additionally, the inventors have found that, by recovering the heat dissipated by the plurality of servers 102 with the cooling fluid and partially recycling it back into electricity via fluid turbine 302, the net power consumption associated with frequency scaling to achieve higher computing performance is improved.

While the disclosed technology has been taught with specific reference to the above embodiments, a person having ordinary skill in the art will recognize that changes can be made in form and detail without departing from the spirit and the scope of the disclosed technology. The described embodiments are to be considered in all respects only as illustrative and not restrictive. All changes that come within the meaning and range of equivalency of the claims are to be embraced within their scope. Combinations of any of the methods, systems, and devices described herein-above are also contemplated and within the scope of the disclosed technology.

I claim:

1. A data center, comprising:
   a plurality of computer servers;
   a cooling subsystem including a cooling fluid for removing heat from said plurality of computer servers, and collecting said cooling fluid following heating thereof by said plurality of computer servers;
   a nitrogen liquefying subsystem liquefying gaseous nitrogen to form liquid nitrogen; and
   a fluid return subsystem combining said liquid nitrogen and said heated cooling fluid and using said liquid nitrogen to cool said heated cooling fluid and to provide pressure for returning said heated cooling fluid, following cooling thereof, to said cooling subsystem. of said plurality of computer servers.

2. The data center of claim 1, further comprising:
   a pressure swing absorber adapted to isolate gaseous nitrogen from ambient air; and
   a wind turbine functionally associated with said pressure swing absorber and with said nitrogen liquefying subsystem, said wind turbine adapted to introduce ambient air into said pressure swing absorber.

3. The data center of claim 2, wherein said cooling subsystem includes a cooling fluid reservoir, and wherein said pressure swing absorber provides said gaseous nitrogen into said cooling fluid reservoir, from where the gaseous nitrogen enters said nitrogen liquefying subsystem.

4. The data center of claim 2, wherein power of said wind turbine power said nitrogen liquefying subsystem.

5. The data center of claim 1, wherein said fluid return subsystem includes:
   a heated fluid expansion chamber;
   a fluid turbine, receiving fluid under pressure from said heated fluid expansion chamber, said fluid under pressure driving said fluid turbine, electricity generated by said fluid turbine adapted to operate at least part of said plurality of computer servers; and
   a fluid return pipe enabling return of said cooling fluid from said fluid turbine to said cooling subsystem.

6. The data center of claim 5, wherein a liquid nitrogen feed pipe extends from said nitrogen liquefying subsystem into said heated fluid expansion chamber, at least partially within said fluid return pipe.

7. The data center of claim 6, wherein liquid nitrogen entering said heated fluid expansion chamber via said liquid nitrogen feed pipe causes an increase in pressure in said heated fluid expansion chamber, resulting in said fluid under pressure provided to said fluid turbine.

8. The data center of claim 1, wherein said plurality of computer servers and said cooling subsystem are arranged such that cooling fluid flows from said cooling subsystem to the vicinity of said plurality of computer servers, and said heated cooling fluid flows from the vicinity of said plurality of computer servers to said fluid return subsystem, under gravitational pull.

9. A heat and power management system for use in a data center including a plurality of computer servers, the heat and power management system comprising: a cooling subsystem including a cooling fluid adapted to remove heat from the plurality of computer servers, and to be collected, following heating thereof by the plurality of computer servers; a nitrogen liquefying subsystem liquefying gaseous nitrogen to form liquid nitrogen; and a fluid return subsystem combining said liquid nitrogen and said heated cooling fluid and using said liquid nitrogen to cool said heated cooling fluid and to provide pressure for returning said heated cooling fluid, following cooling thereof, to said cooling subsystem, wherein said fluid return subsystem includes a fluid turbine driven by said heated cooling fluid and adapted to provide power to at least part of said plurality of computer servers.

10. The heat and power management system of claim 9, further comprising:
a pressure swing absorber adapted to isolate gaseous nitrogen from ambient air and to provide said gaseous nitrogen into said nitrogen liquefying subsystem via said cooling subsystem; and
a wind turbine functionally associated with said pressure swing absorber and with said nitrogen liquefying subsystem, said wind turbine adapted to introduce ambient air into said pressure swing absorber,
wherein power generated from said wind turbine is adapted to power said nitrogen liquefying subsystem.

11. The heat and power management system of claim 9, wherein said fluid return subsystem includes a fluid return pipe enabling return of said cooling fluid from said fluid turbine to said cooling subsystem.

12. The heat and power management system of claim 11, wherein a liquid nitrogen feed pipe extends from said nitrogen liquefying subsystem into said heated fluid expansion chamber, at least partially within said fluid return pipe.

13. The heat and power management system of claim 12, wherein the vaporization of liquid nitrogen entering said heated fluid expansion chamber via said liquid nitrogen feed pipe causes an increase in pressure in said heated fluid expansion chamber, resulting in said fluid under pressure provided to said fluid turbine.

14. The heat and power management system of claim 9, wherein said system is arranged such that cooling fluid flows from said cooling subsystem to the vicinity of the plurality of computer servers, and said heated cooling fluid flows from the vicinity of the plurality of computer servers to said fluid return subsystem, under gravitational pull.

15. A method for cooling a plurality of computer servers in a data center, the method comprising: providing gaseous nitrogen into a cooling fluid disposed in a cooling fluid reservoir; liquefying gaseous nitrogen from said cooling fluid reservoir to form liquid nitrogen; allowing said cooling fluid to flow from said cooling fluid reservoir to a vicinity of the plurality of computer servers, to collect heat therefrom; allowing the heated cooling fluid to flow from the vicinity of the plurality of computer servers to a heated fluid expansion chamber; pushing said heated cooling fluid, under pressure, from said heated fluid expansion chamber, via a fluid turbine and a return pipe, back to said cooling fluid reservoir; combining said liquid nitrogen and said heated cooling fluid, and using said liquid nitrogen, to cool said heated cooling fluid while said heated cooling fluid is flowing in said return pipe.

16. The method of claim 15, wherein said providing gaseous nitrogen comprises:
using a wind turbine, introducing ambient air into the data center;
isolating gaseous nitrogen from said ambient air; and
providing said isolated gaseous nitrogen into said cooling fluid,
wherein said liquefying is carried out using power generated from mechanical power of wind by said wind turbine.

17. The method of claim 15, wherein said pushing said heating cooling fluid comprises introducing into said heated fluid expansion chamber at least some of said liquid nitrogen, such that evaporation of said at least some liquid nitrogen increases pressure within said heated fluid expansion chamber.

18. The method of claim 15, further comprising generating power from said fluid turbine when said heated cooling fluid under pressure flows through said fluid turbine, and using said power to power at least some of said plurality of computer servers.

19. The method of claim 15, wherein said cooling said heated cooling fluid comprises providing flowing liquid nitrogen through a liquid nitrogen pipe disposed within said return pipe while said heated cooling fluid is flowing through said return pipe, such that said liquid nitrogen absorbs heat from said heated cooling fluid in said return pipe.

20. The method of claim 15, wherein said cooling fluid flows from said cooling fluid reservoir to a vicinity of the plurality of computer servers and said heated cooling fluid flows from the vicinity of the plurality of computer servers to said heated fluid expansion chamber under gravitational pull.

* * * * *